(12) United States Patent
Campbell et al.

(10) Patent No.: US 9,073,123 B2
(45) Date of Patent: Jul. 7, 2015

(54) HOUSING VENTS

(75) Inventors: John Stephen Campbell, Puyallup, WA (US); Andrew W. Hill, Redmond, WA (US); Shane Aaron Sykes, Woodinville, WA (US); Jan Raken, Seattle, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 98 days.

(21) Appl. No.: 13/599,763

(22) Filed: Aug. 30, 2012

(65) Prior Publication Data

US 2013/0335902 A1 Dec. 19, 2013

Related U.S. Application Data

(60) Provisional application No. 61/659,349, filed on Jun. 13, 2012.

(51) Int. Cl.
| | |
|---|---|
| *H05K 7/20* | (2006.01) |
| *B22F 3/22* | (2006.01) |
| *G06F 1/20* | (2006.01) |
| *G06F 1/16* | (2006.01) |
| *G06F 1/18* | (2006.01) |

(52) U.S. Cl.
CPC *B22F 3/225* (2013.01); *H05K 7/20* (2013.01); *G06F 1/203* (2013.01); *G06F 1/1656* (2013.01); *G06F 1/181* (2013.01); *G06F 1/20* (2013.01)

(58) Field of Classification Search
USPC .................. 361/675–678, 679.46–679.54, 361/688–722, 752, 760–762, 831
See application file for complete search history.

(56) References Cited

U.S. PATENT DOCUMENTS

| | | | |
|---|---|---|---|
| 3,879,586 | A | 4/1975 | DuRocher et al. |
| 4,046,975 | A | 9/1977 | Seeger, Jr. |
| 4,065,649 | A | 12/1977 | Carter et al. |
| 4,243,861 | A | 1/1981 | Strandwitz |
| 4,261,042 | A | 4/1981 | Ishiwatari et al. |
| 4,279,021 | A | 7/1981 | See et al. |
| 4,302,648 | A | 11/1981 | Sado et al. |
| 4,317,013 | A | 2/1982 | Larson |
| 4,326,193 | A | 4/1982 | Markley et al. |

(Continued)

FOREIGN PATENT DOCUMENTS

| | | |
|---|---|---|
| EP | 2353978 | 8/2011 |
| EP | 2378607 | 10/2011 |

(Continued)

OTHER PUBLICATIONS

"Accessing Device Sensors", retrieved from <https://developer.palm.com/content/api/dev-guide/pdk/accessing-device-sensors.html> on May 25, 2012, 4 pages.

(Continued)

*Primary Examiner* — Courtney Smith
(74) *Attorney, Agent, or Firm* — Gregg Wisdom; Judy Yee; Micky Minhas

(57) ABSTRACT

Housing vent techniques are described. In one or more implementations, a molding process is used to form a housing of a computing device that includes a plurality of ribs disposed within an internal surface of the housing. A cutting operation is performed to an outer surface of the housing that is opposite to the internal surface to remove material of the housing between the plurality of ribs to form one or more vents that are configured to permit air to pass between an interior and exterior of the housing.

12 Claims, 6 Drawing Sheets

(56) References Cited

U.S. PATENT DOCUMENTS

| | | | |
|---|---|---|---|
| 4,365,130 A | 12/1982 | Christensen | |
| 4,492,829 A | 1/1985 | Rodrique | |
| 4,527,021 A | 7/1985 | Morikawa et al. | |
| 4,559,426 A | 12/1985 | Van Zeeland et al. | |
| 4,588,187 A | 5/1986 | Dell | |
| 4,607,147 A | 8/1986 | Ono et al. | |
| 4,651,133 A | 3/1987 | Ganesan et al. | |
| 5,021,638 A | 6/1991 | Nopper et al. | |
| 5,220,521 A | 6/1993 | Kikinis | |
| 5,283,559 A | 2/1994 | Kalendra et al. | |
| 5,331,443 A | 7/1994 | Stanisci | |
| 5,340,528 A | 8/1994 | Machida et al. | |
| 5,363,075 A | 11/1994 | Fanucchi | |
| 5,404,133 A | 4/1995 | Moriike et al. | |
| 5,510,783 A | 4/1996 | Findlater et al. | |
| 5,548,477 A | 8/1996 | Kumar et al. | |
| 5,558,577 A | 9/1996 | Kato | |
| 5,576,981 A | 11/1996 | Parker et al. | |
| 5,618,232 A | 4/1997 | Martin | |
| 5,681,220 A | 10/1997 | Bertram et al. | |
| 5,745,376 A | 4/1998 | Barker et al. | |
| 5,748,114 A | 5/1998 | Koehn | |
| 5,781,406 A | 7/1998 | Hunte | |
| 5,807,175 A | 9/1998 | Davis et al. | |
| 5,818,361 A | 10/1998 | Acevedo | |
| 5,828,770 A | 10/1998 | Leis et al. | |
| 5,874,697 A | 2/1999 | Selker et al. | |
| 5,926,170 A | 7/1999 | Oba | |
| 5,957,191 A | 9/1999 | Okada et al. | |
| 5,971,635 A | 10/1999 | Wise | |
| 6,002,389 A | 12/1999 | Kasser | |
| 6,005,209 A | 12/1999 | Burleson et al. | |
| 6,012,714 A | 1/2000 | Worley et al. | |
| 6,040,823 A | 3/2000 | Seffernick et al. | |
| 6,042,075 A | 3/2000 | Burch, Jr. | |
| 6,044,717 A | 4/2000 | Biegelsen et al. | |
| 6,055,705 A | 5/2000 | Komatsu et al. | |
| 6,061,644 A | 5/2000 | Leis | |
| 6,112,797 A | 9/2000 | Colson et al. | |
| 6,147,859 A * | 11/2000 | Abboud | 361/679.39 |
| 6,178,443 B1 | 1/2001 | Lin | |
| 6,254,105 B1 | 7/2001 | Rinde et al. | |
| 6,266,685 B1 | 7/2001 | Danielson et al. | |
| 6,279,060 B1 | 8/2001 | Luke et al. | |
| 6,329,617 B1 | 12/2001 | Burgess | |
| 6,344,791 B1 | 2/2002 | Armstrong | |
| 6,380,497 B1 | 4/2002 | Hashimoto et al. | |
| 6,437,682 B1 | 8/2002 | Vance | |
| 6,442,764 B1 | 9/2002 | Badillo et al. | |
| 6,506,983 B1 | 1/2003 | Babb et al. | |
| 6,511,378 B1 | 1/2003 | Bhatt et al. | |
| 6,532,147 B1 | 3/2003 | Christ, Jr. | |
| 6,543,949 B1 | 4/2003 | Ritchey et al. | |
| 6,565,439 B2 | 5/2003 | Shinohara et al. | |
| 6,585,435 B2 | 7/2003 | Fang | |
| 6,600,121 B1 | 7/2003 | Olodort et al. | |
| 6,603,408 B1 | 8/2003 | Gaba | |
| 6,608,664 B1 | 8/2003 | Hasegawa | |
| 6,617,536 B2 | 9/2003 | Kawaguchi | |
| 6,675,865 B1 | 1/2004 | Yoshida | |
| 6,685,369 B2 | 2/2004 | Lien | |
| 6,704,864 B1 | 3/2004 | Philyaw | |
| 6,721,019 B2 | 4/2004 | Kono et al. | |
| 6,725,318 B1 | 4/2004 | Sherman et al. | |
| 6,738,049 B2 | 5/2004 | Kiser et al. | |
| 6,774,888 B1 | 8/2004 | Genduso | |
| 6,776,546 B2 | 8/2004 | Kraus et al. | |
| 6,784,869 B1 | 8/2004 | Clark et al. | |
| 6,813,143 B2 | 11/2004 | Makela | |
| 6,819,316 B2 | 11/2004 | Schulz et al. | |
| 6,819,547 B2 | 11/2004 | Minaguchi et al. | |
| 6,856,506 B2 | 2/2005 | Doherty et al. | |
| 6,861,961 B2 | 3/2005 | Sandbach et al. | |
| 6,864,573 B2 * | 3/2005 | Robertson et al. | 257/718 |
| 6,898,315 B2 | 5/2005 | Guha | |
| 6,914,197 B2 | 7/2005 | Doherty et al. | |
| 6,950,950 B2 | 9/2005 | Sawyers et al. | |
| 6,962,454 B1 | 11/2005 | Costello | |
| 6,970,957 B1 | 11/2005 | Oshins et al. | |
| 6,976,799 B2 | 12/2005 | Kim et al. | |
| 7,051,149 B2 | 5/2006 | Wang et al. | |
| 7,083,295 B2 | 8/2006 | Hanna | |
| 7,091,436 B2 | 8/2006 | Serban | |
| 7,091,955 B2 | 8/2006 | Kramer | |
| 7,095,404 B2 | 8/2006 | Vincent et al. | |
| 7,106,222 B2 | 9/2006 | Ward et al. | |
| 7,116,309 B1 | 10/2006 | Kimura et al. | |
| 7,123,292 B1 | 10/2006 | Seeger et al. | |
| 7,194,662 B2 | 3/2007 | Do et al. | |
| 7,202,837 B2 | 4/2007 | Ihara | |
| 7,213,991 B2 | 5/2007 | Chapman et al. | |
| 7,277,087 B2 | 10/2007 | Hill et al. | |
| 7,280,348 B2 | 10/2007 | Ghosh | |
| 7,365,967 B2 | 4/2008 | Zheng | |
| 7,401,992 B1 | 7/2008 | Lin | |
| 7,423,557 B2 | 9/2008 | Kang | |
| 7,437,193 B2 | 10/2008 | Parramon et al. | |
| 7,447,934 B2 | 11/2008 | Dasari et al. | |
| 7,469,386 B2 | 12/2008 | Bear et al. | |
| 7,499,037 B2 | 3/2009 | Lube | |
| 7,502,803 B2 | 3/2009 | Culter et al. | |
| 7,542,052 B2 | 6/2009 | Solomon et al. | |
| 7,558,594 B2 | 7/2009 | Wilson | |
| 7,559,834 B1 | 7/2009 | York | |
| 7,620,244 B1 | 11/2009 | Collier | |
| 7,622,907 B2 | 11/2009 | Vranish | |
| 7,623,121 B2 | 11/2009 | Dodge | |
| 7,626,358 B2 | 12/2009 | Lam et al. | |
| 7,636,921 B2 | 12/2009 | Louie | |
| 7,639,329 B2 | 12/2009 | Takeda et al. | |
| 7,639,876 B2 | 12/2009 | Clary et al. | |
| 7,656,392 B2 | 2/2010 | Bolender | |
| 7,686,066 B2 | 3/2010 | Hirao | |
| 7,722,792 B2 | 5/2010 | Uezaki et al. | |
| 7,733,326 B1 | 6/2010 | Adiseshan | |
| 7,773,076 B2 | 8/2010 | Pittel et al. | |
| 7,777,972 B1 | 8/2010 | Chen et al. | |
| 7,782,342 B2 | 8/2010 | Koh | |
| 7,813,715 B2 | 10/2010 | McKillop et al. | |
| 7,817,428 B2 * | 10/2010 | Greer et al. | 361/720 |
| 7,884,807 B2 | 2/2011 | Hovden et al. | |
| 7,893,921 B2 | 2/2011 | Sato | |
| 7,907,394 B2 * | 3/2011 | Richardson et al. | 361/679.3 |
| D636,397 S | 4/2011 | Green | |
| 7,928,964 B2 | 4/2011 | Kolmykov-Zotov et al. | |
| 7,932,890 B2 | 4/2011 | Onikiri et al. | |
| 7,944,520 B2 | 5/2011 | Ichioka et al. | |
| 7,945,717 B2 | 5/2011 | Rivalsi | |
| 7,973,771 B2 | 7/2011 | Geaghan | |
| 7,978,281 B2 | 7/2011 | Vergith et al. | |
| 8,018,386 B2 | 9/2011 | Qi et al. | |
| 8,026,904 B2 | 9/2011 | Westerman | |
| 8,053,688 B2 | 11/2011 | Conzola et al. | |
| 8,059,384 B2 | 11/2011 | Park et al. | |
| 8,065,624 B2 | 11/2011 | Morin et al. | |
| 8,069,356 B2 | 11/2011 | Rathi et al. | |
| 8,077,160 B2 | 12/2011 | Land et al. | |
| 8,120,166 B2 | 2/2012 | Koizumi et al. | |
| 8,130,203 B2 | 3/2012 | Westerman | |
| 8,154,524 B2 | 4/2012 | Wilson et al. | |
| D659,139 S | 5/2012 | Gengler | |
| 8,169,421 B2 | 5/2012 | Wright et al. | |
| 8,229,509 B2 | 7/2012 | Paek et al. | |
| 8,229,522 B2 | 7/2012 | Kim et al. | |
| 8,269,093 B2 | 9/2012 | Naik et al. | |
| 8,363,036 B2 | 1/2013 | Liang | |
| 8,403,576 B2 | 3/2013 | Merz | |
| 8,582,280 B2 | 11/2013 | Ryu | |
| 8,654,030 B1 | 2/2014 | Mercer | |
| 8,991,473 B2 | 3/2015 | Bornemann et al. | |
| 9,027,631 B2 | 5/2015 | Bornemann et al. | |
| 2001/0035859 A1 | 11/2001 | Kiser | |
| 2002/0000977 A1 | 1/2002 | Vranish | |
| 2002/0126445 A1 | 9/2002 | Minaguchi et al. | |

(56) References Cited

U.S. PATENT DOCUMENTS

| | | |
|---|---|---|
| 2002/0134828 A1 | 9/2002 | Sandbach et al. |
| 2002/0154099 A1 | 10/2002 | Oh |
| 2002/0188721 A1 | 12/2002 | Lemel et al. |
| 2002/0195177 A1 | 12/2002 | Hinkley et al. |
| 2003/0016282 A1 | 1/2003 | Koizumi |
| 2003/0044215 A1 | 3/2003 | Monney et al. |
| 2003/0132916 A1 | 7/2003 | Kramer |
| 2003/0173195 A1 | 9/2003 | Federspiel |
| 2003/0197687 A1 | 10/2003 | Shetter |
| 2004/0005184 A1 | 1/2004 | Kim et al. |
| 2004/0100457 A1 | 5/2004 | Mandle |
| 2004/0174670 A1 | 9/2004 | Huang et al. |
| 2004/0190239 A1 | 9/2004 | Weng et al. |
| 2004/0212598 A1 | 10/2004 | Kraus et al. |
| 2004/0258924 A1 | 12/2004 | Berger et al. |
| 2004/0268000 A1 | 12/2004 | Barker et al. |
| 2005/0030728 A1 | 2/2005 | Kawashima et al. |
| 2005/0057515 A1 | 3/2005 | Bathiche |
| 2005/0057521 A1 | 3/2005 | Aull et al. |
| 2005/0059489 A1 | 3/2005 | Kim |
| 2005/0146512 A1 | 7/2005 | Hill et al. |
| 2005/0190159 A1 | 9/2005 | Skarine |
| 2005/0240949 A1 | 10/2005 | Liu et al. |
| 2005/0264653 A1 | 12/2005 | Starkweather et al. |
| 2005/0264988 A1 | 12/2005 | Nicolosi |
| 2005/0285703 A1 | 12/2005 | Wheeler et al. |
| 2006/0049993 A1 | 3/2006 | Lin et al. |
| 2006/0061555 A1 | 3/2006 | Mullen |
| 2006/0082973 A1* | 4/2006 | Egbert et al. .......... 361/709 |
| 2006/0085658 A1 | 4/2006 | Allen et al. |
| 2006/0103633 A1 | 5/2006 | Gioeli |
| 2006/0125799 A1 | 6/2006 | Hillis et al. |
| 2006/0154725 A1 | 7/2006 | Glaser et al. |
| 2006/0156415 A1 | 7/2006 | Rubinstein et al. |
| 2006/0181514 A1 | 8/2006 | Newman |
| 2006/0181521 A1 | 8/2006 | Perreault et al. |
| 2006/0195522 A1 | 8/2006 | Miyazaki |
| 2006/0197755 A1 | 9/2006 | Bawany |
| 2006/0238510 A1 | 10/2006 | Panotopoulos et al. |
| 2006/0254042 A1 | 11/2006 | Chou et al. |
| 2007/0051766 A1 | 3/2007 | Spencer |
| 2007/0051792 A1 | 3/2007 | Wheeler et al. |
| 2007/0062089 A1 | 3/2007 | Homer et al. |
| 2007/0072474 A1 | 3/2007 | Beasley et al. |
| 2007/0182663 A1 | 8/2007 | Biech |
| 2007/0200830 A1 | 8/2007 | Yamamoto |
| 2007/0234420 A1 | 10/2007 | Novotney et al. |
| 2007/0236408 A1 | 10/2007 | Yamaguchi et al. |
| 2007/0247338 A1 | 10/2007 | Marchetto |
| 2007/0247432 A1 | 10/2007 | Oakley |
| 2007/0257821 A1 | 11/2007 | Son et al. |
| 2007/0260892 A1 | 11/2007 | Paul et al. |
| 2007/0283179 A1 | 12/2007 | Burnett et al. |
| 2008/0005423 A1 | 1/2008 | Jacobs et al. |
| 2008/0018611 A1 | 1/2008 | Serban et al. |
| 2008/0104437 A1 | 5/2008 | Lee |
| 2008/0151478 A1 | 6/2008 | Chern |
| 2008/0158185 A1 | 7/2008 | Westerman |
| 2008/0167832 A1 | 7/2008 | Soss |
| 2008/0180411 A1 | 7/2008 | Solomon et al. |
| 2008/0232061 A1 | 9/2008 | Wang et al. |
| 2008/0238884 A1 | 10/2008 | Harish |
| 2008/0253822 A1 | 10/2008 | Matias |
| 2008/0297878 A1 | 12/2008 | Brown et al. |
| 2008/0309636 A1 | 12/2008 | Feng et al. |
| 2008/0316002 A1 | 12/2008 | Brunet et al. |
| 2008/0320190 A1 | 12/2008 | Lydon et al. |
| 2009/0002218 A1 | 1/2009 | Rigazio et al. |
| 2009/0007001 A1 | 1/2009 | Morin et al. |
| 2009/0009476 A1 | 1/2009 | Daley, III |
| 2009/0046416 A1 | 2/2009 | Daley, III |
| 2009/0049979 A1 | 2/2009 | Naik et al. |
| 2009/0065267 A1 | 3/2009 | Sato |
| 2009/0073060 A1 | 3/2009 | Shimasaki et al. |
| 2009/0073957 A1 | 3/2009 | Newland et al. |
| 2009/0079639 A1 | 3/2009 | Hotta et al. |
| 2009/0096756 A1 | 4/2009 | Lube |
| 2009/0102794 A1 | 4/2009 | Lapstun et al. |
| 2009/0127005 A1 | 5/2009 | Zachut et al. |
| 2009/0135142 A1 | 5/2009 | Fu et al. |
| 2009/0140985 A1 | 6/2009 | Liu |
| 2009/0163147 A1 | 6/2009 | Steigerwald et al. |
| 2009/0174687 A1 | 7/2009 | Ciesla et al. |
| 2009/0182901 A1 | 7/2009 | Callaghan et al. |
| 2009/0189873 A1 | 7/2009 | Peterson |
| 2009/0219250 A1 | 9/2009 | Ure |
| 2009/0251008 A1 | 10/2009 | Sugaya |
| 2009/0262492 A1 | 10/2009 | Whitchurch et al. |
| 2009/0303137 A1 | 12/2009 | Kusaka et al. |
| 2009/0303204 A1 | 12/2009 | Nasiri et al. |
| 2009/0320244 A1 | 12/2009 | Lin |
| 2009/0321490 A1 | 12/2009 | Groene et al. |
| 2010/0001963 A1 | 1/2010 | Doray et al. |
| 2010/0021022 A1 | 1/2010 | Pittel et al. |
| 2010/0026656 A1 | 2/2010 | Hotelling et al. |
| 2010/0038821 A1 | 2/2010 | Jenkins et al. |
| 2010/0045540 A1 | 2/2010 | Lai et al. |
| 2010/0045609 A1 | 2/2010 | Do et al. |
| 2010/0045633 A1 | 2/2010 | Gettemy |
| 2010/0051356 A1 | 3/2010 | Stern et al. |
| 2010/0051432 A1 | 3/2010 | Lin et al. |
| 2010/0053534 A1 | 3/2010 | Hsieh et al. |
| 2010/0075517 A1 | 3/2010 | Ni et al. |
| 2010/0077237 A1 | 3/2010 | Sawyers |
| 2010/0081377 A1 | 4/2010 | Chatterjee et al. |
| 2010/0085321 A1 | 4/2010 | Pundsack |
| 2010/0103112 A1 | 4/2010 | Yoo et al. |
| 2010/0103131 A1 | 4/2010 | Segal et al. |
| 2010/0149111 A1 | 6/2010 | Olien |
| 2010/0149134 A1 | 6/2010 | Westerman et al. |
| 2010/0156798 A1 | 6/2010 | Archer |
| 2010/0161522 A1 | 6/2010 | Tirpak et al. |
| 2010/0162109 A1 | 6/2010 | Chatterjee et al. |
| 2010/0164857 A1 | 7/2010 | Liu et al. |
| 2010/0171891 A1 | 7/2010 | Kaji et al. |
| 2010/0174421 A1 | 7/2010 | Tsai et al. |
| 2010/0180063 A1 | 7/2010 | Ananny et al. |
| 2010/0188299 A1 | 7/2010 | Rinehart et al. |
| 2010/0188338 A1 | 7/2010 | Longe |
| 2010/0206614 A1 | 8/2010 | Park et al. |
| 2010/0206644 A1 | 8/2010 | Yeh |
| 2010/0214257 A1 | 8/2010 | Wussler et al. |
| 2010/0222110 A1 | 9/2010 | Kim et al. |
| 2010/0231556 A1 | 9/2010 | Mines et al. |
| 2010/0238075 A1 | 9/2010 | Pourseyed |
| 2010/0238119 A1 | 9/2010 | Dubrovsky et al. |
| 2010/0245221 A1 | 9/2010 | Khan |
| 2010/0250988 A1 | 9/2010 | Okuda et al. |
| 2010/0274932 A1 | 10/2010 | Kose |
| 2010/0279768 A1 | 11/2010 | Huang et al. |
| 2010/0289457 A1 | 11/2010 | Onnerud et al. |
| 2010/0295812 A1 | 11/2010 | Burns et al. |
| 2010/0302378 A1 | 12/2010 | Marks et al. |
| 2010/0304793 A1 | 12/2010 | Kim |
| 2010/0306538 A1 | 12/2010 | Thomas et al. |
| 2010/0308778 A1 | 12/2010 | Yamazaki et al. |
| 2010/0308844 A1 | 12/2010 | Day et al. |
| 2010/0315348 A1 | 12/2010 | Jellicoe et al. |
| 2010/0321301 A1 | 12/2010 | Casparian et al. |
| 2010/0325155 A1 | 12/2010 | Skinner et al. |
| 2010/0331059 A1 | 12/2010 | Apgar et al. |
| 2011/0007008 A1 | 1/2011 | Algreatly |
| 2011/0012873 A1 | 1/2011 | Prest et al. |
| 2011/0019123 A1 | 1/2011 | Prest et al. |
| 2011/0031287 A1 | 2/2011 | Le Gette et al. |
| 2011/0037721 A1 | 2/2011 | Cranfill et al. |
| 2011/0043990 A1 | 2/2011 | Mickey et al. |
| 2011/0050587 A1 | 3/2011 | Natanzon et al. |
| 2011/0057899 A1 | 3/2011 | Sleeman et al. |
| 2011/0060926 A1 | 3/2011 | Brooks et al. |
| 2011/0069148 A1 | 3/2011 | Jones et al. |
| 2011/0074688 A1 | 3/2011 | Hull et al. |
| 2011/0095994 A1 | 4/2011 | Birnbaum |
| 2011/0096513 A1 | 4/2011 | Kim |

(56) References Cited

U.S. PATENT DOCUMENTS

| | | |
|---|---|---|
| 2011/0102326 A1 | 5/2011 | Casparian et al. |
| 2011/0102356 A1 | 5/2011 | Kemppinen et al. |
| 2011/0134032 A1 | 6/2011 | Chiu et al. |
| 2011/0157087 A1 | 6/2011 | Kanehira et al. |
| 2011/0163955 A1 | 7/2011 | Nasiri et al. |
| 2011/0164370 A1 | 7/2011 | McClure et al. |
| 2011/0167181 A1 | 7/2011 | Minoo et al. |
| 2011/0167287 A1 | 7/2011 | Walsh et al. |
| 2011/0167391 A1 | 7/2011 | Momeyer et al. |
| 2011/0167992 A1 | 7/2011 | Eventoff et al. |
| 2011/0179864 A1 | 7/2011 | Raasch et al. |
| 2011/0184646 A1 | 7/2011 | Wong et al. |
| 2011/0193787 A1 | 8/2011 | Morishige et al. |
| 2011/0205372 A1 | 8/2011 | Miramontes |
| 2011/0227913 A1 | 9/2011 | Hyndman |
| 2011/0234502 A1 | 9/2011 | Yun et al. |
| 2011/0242138 A1 | 10/2011 | Tribble |
| 2011/0248920 A1 | 10/2011 | Larsen |
| 2011/0248941 A1 | 10/2011 | Abdo et al. |
| 2011/0261001 A1 | 10/2011 | Liu |
| 2011/0266672 A1 | 11/2011 | Sylvester |
| 2011/0267300 A1 | 11/2011 | Serban et al. |
| 2011/0290686 A1 | 12/2011 | Huang |
| 2011/0297566 A1 | 12/2011 | Gallagher et al. |
| 2011/0304577 A1 | 12/2011 | Brown |
| 2011/0304962 A1 | 12/2011 | Su |
| 2011/0305875 A1 | 12/2011 | Sanford et al. |
| 2011/0316807 A1 | 12/2011 | Corrion |
| 2012/0007821 A1 | 1/2012 | Zaliva |
| 2012/0011462 A1 | 1/2012 | Westerman et al. |
| 2012/0013519 A1 | 1/2012 | Hakansson et al. |
| 2012/0023459 A1 | 1/2012 | Westerman |
| 2012/0024682 A1 | 2/2012 | Huang et al. |
| 2012/0026048 A1 | 2/2012 | Vazquez et al. |
| 2012/0032887 A1 | 2/2012 | Chiu et al. |
| 2012/0044179 A1 | 2/2012 | Hudson |
| 2012/0047368 A1 | 2/2012 | Chinn et al. |
| 2012/0050975 A1 | 3/2012 | Garelli et al. |
| 2012/0068933 A1 | 3/2012 | Larsen |
| 2012/0072167 A1 | 3/2012 | Cretella, Jr. et al. |
| 2012/0075249 A1 | 3/2012 | Hoch |
| 2012/0081316 A1 | 4/2012 | Sirpal et al. |
| 2012/0087078 A1 | 4/2012 | Medica et al. |
| 2012/0092279 A1 | 4/2012 | Martin |
| 2012/0094257 A1 | 4/2012 | Pillischer et al. |
| 2012/0099263 A1 | 4/2012 | Lin |
| 2012/0099749 A1 | 4/2012 | Rubin et al. |
| 2012/0103778 A1 | 5/2012 | Obata et al. |
| 2012/0106082 A1 | 5/2012 | Wu et al. |
| 2012/0115553 A1 | 5/2012 | Mahe et al. |
| 2012/0117409 A1 | 5/2012 | Lee et al. |
| 2012/0127118 A1 | 5/2012 | Nolting et al. |
| 2012/0133561 A1 | 5/2012 | Konanur et al. |
| 2012/0140396 A1 | 6/2012 | Zeliff et al. |
| 2012/0145525 A1 | 6/2012 | Ishikawa |
| 2012/0155015 A1* | 6/2012 | Govindasamy et al. . 361/679.46 |
| 2012/0162693 A1 | 6/2012 | Ito |
| 2012/0182242 A1 | 7/2012 | Lindahl et al. |
| 2012/0194393 A1 | 8/2012 | Uttermann et al. |
| 2012/0194448 A1 | 8/2012 | Rothkopf |
| 2012/0223866 A1 | 9/2012 | Ayala Vazquez et al. |
| 2012/0224073 A1 | 9/2012 | Miyahara |
| 2012/0227259 A1 | 9/2012 | Badaye et al. |
| 2012/0235635 A1 | 9/2012 | Sato |
| 2012/0235921 A1 | 9/2012 | Laubach |
| 2012/0246377 A1 | 9/2012 | Bhesania |
| 2012/0256959 A1 | 10/2012 | Ye et al. |
| 2012/0274811 A1 | 11/2012 | Bakin |
| 2012/0287562 A1 | 11/2012 | Wu et al. |
| 2012/0298491 A1 | 11/2012 | Ozias et al. |
| 2012/0300275 A1 | 11/2012 | Vilardell et al. |
| 2012/0328349 A1 | 12/2012 | Isaac et al. |
| 2013/0044059 A1 | 2/2013 | Fu |
| 2013/0050922 A1 | 2/2013 | Lee et al. |
| 2013/0063873 A1 | 3/2013 | Wodrich et al. |
| 2013/0076635 A1 | 3/2013 | Lin |
| 2013/0093388 A1 | 4/2013 | Partovi |
| 2013/0106723 A1 | 5/2013 | Bakken et al. |
| 2013/0107144 A1 | 5/2013 | Marhefka et al. |
| 2013/0227836 A1 | 9/2013 | Whitt, III |
| 2013/0228435 A1 | 9/2013 | Whitt, III |
| 2013/0229356 A1 | 9/2013 | Marwah |
| 2013/0229366 A1 | 9/2013 | Dighde |
| 2013/0229386 A1 | 9/2013 | Bathiche |
| 2013/0229759 A1 | 9/2013 | Whitt, III |
| 2013/0241860 A1 | 9/2013 | Ciesla et al. |
| 2013/0278552 A1 | 10/2013 | Kamin-Lyndgaard |
| 2013/0335330 A1 | 12/2013 | Lane |
| 2013/0335903 A1 | 12/2013 | Raken |
| 2013/0342464 A1 | 12/2013 | Bathiche et al. |
| 2013/0342465 A1 | 12/2013 | Bathiche |
| 2013/0346636 A1 | 12/2013 | Bathiche |
| 2014/0028635 A1 | 1/2014 | Krah |
| 2014/0029183 A1 | 1/2014 | Ashcraft et al. |
| 2014/0117928 A1 | 5/2014 | Liao |
| 2014/0131000 A1 | 5/2014 | Bornemann et al. |
| 2014/0135060 A1 | 5/2014 | Mercer |
| 2014/0148938 A1 | 5/2014 | Zhang |
| 2014/0154523 A1 | 6/2014 | Bornemann |
| 2014/0166227 A1 | 6/2014 | Bornemann |
| 2014/0248506 A1 | 9/2014 | McCormack |

FOREIGN PATENT DOCUMENTS

| | | |
|---|---|---|
| GB | 1100331 | 1/1968 |
| GB | 2178570 | 2/1987 |
| JP | 56159134 | 12/1981 |
| JP | 10326124 | 12/1998 |
| JP | 11345041 | 12/1999 |
| KR | 20060003093 | 1/2006 |
| NL | 1038411 | 5/2012 |
| WO | WO 2008055039 | 5/2008 |
| WO | WO-2010011983 | 1/2010 |
| WO | WO 2010105272 | 9/2010 |
| WO | WO 2011049609 | 4/2011 |
| WO | WO 2012036717 | 3/2012 |

OTHER PUBLICATIONS

"ACPI Docking for Windows Operating Systems", Retrieved from: <http://www.scritube.com/limba/engleza/software/ACPI-Docking-for-Windows-Opera331824193.php> on Jul. 6, 2012,10 pages.

"Cirago Slim Case®—Protective case with built-in kickstand for your iPhone 5®", Retrieved from <http://cirago.com/wordpress/wp-content/uploads/2012/10/ipc1500brochure1.pdf> on Jan. 29, 2013,1 page.

"DR2PA", retrieved from <http://www.architainment.co.uk/wp-content/uploads/2012/08/DR2PA-AU-US-size-Data-Sheet-Rev-H_LOGO.pdf> on Sep. 17, 2012, 4 pages.

"First One Handed Fabric Keyboard with Bluetooth Wireless Technology", Retrieved from: <http://press.xtvworld.com/article3817.html> on May 8, 2012,(Jan. 6, 2005), 2 pages.

"Force and Position Sensing Resistors: An Emerging Technology", *Interlink Electronics*, Available at <http://staff.science.uva.nl/~vlaander/docu/FSR/An_Exploring_Technology.pdf>,(Feb. 1990), pp. 1-6.

"Frogpad Introduces Weareable Fabric Keyboard with Bluetooth Technology", Retrieved from: <http://www.geekzone.co.nz/contentasp?contentid=3898> on May 7, 2012,(Jan. 7, 2005), 3 pages.

"How to Use the iPad's Onscreen Keyboard", Retrieved from <http://www.dummies.com/how-to/content/how-to-use-the-ipads-onscreen-keyboard.html> on Aug. 28, 2012, 3 pages.

"Incipio LG G-Slate Premium Kickstand Case—Black Nylon", Retrieved from: <http://www.amazon.com/Incipio-G-Slate-Premium-Kickstand-Case/dp/B004ZKP916> on May 8, 2012, 4 pages.

"Membrane Keyboards & Membrane Keypads", Retrieved from: <http://www.pannam.com/> on May 9, 2012,(Mar. 4, 2009), 2 pages.

"Motion Sensors", *Android Developers*, retrieved from, <http://developer.android.com/guide/topics/sensors/sensors_motion.html> on May 25, 2012, 7 pages.

(56) References Cited

OTHER PUBLICATIONS

"NI Releases New Maschine & Maschine Mikro", Retrieved from <http://www.djbooth.net/index/dj-equipment/entry/ni-releases-new-maschine-mikro/> on Sep. 17, 2012, 19 pages.
"Non-Final Office Action", U.S. Appl. No. 13/471,001, (Feb. 19, 2013),15 pages.
"Non-Final Office Action", U.S. Appl. No. 13/471,139, (Mar. 21, 2013),12 pages.
"Non-Final Office Action", U.S. Appl. No. 13/471,202, (Feb. 11, 2013),10 pages.
"Non-Final Office Action", U.S. Appl. No. 13/471,336, (Jan. 18, 2013),14 pages.
"Non-Final Office Action", U.S. Appl. No. 13/651,195, (Jan. 2, 2013),14 pages.
"Non-Final Office Action", U.S. Appl. No. 13/651,232, (Jan. 17, 2013),15 pages.
"Non-Final Office Action", U.S. Appl. No. 13/651,272, (Feb. 12, 2013),10 pages.
"Non-Final Office Action", U.S. Appl. No. 13/651,287, (Jan. 29, 2013),13 pages.
"Non-Final Office Action", U.S. Appl. No. 13/651,304, (Mar. 22, 2013), 9 pages.
"Non-Final Office Action", U.S. Appl. No. 13/651,327, (Mar. 22, 2013), 6 pages.
"Non-Final Office Action", U.S. Appl. No. 13/651,871, (Mar. 18, 2013),14 pages.
"Non-Final Office Action", U.S. Appl. No. 13/651,976, (Feb. 22, 2013),16 pages.
"Non-Final Office Action", U.S. Appl. No. 13/653,321, (Feb. 1, 2013),13 pages.
"Non-Final Office Action", U.S. Appl. No. 13/653,682, (Feb. 7, 2013),11 pages.
"Non-Final Office Action", U.S. Appl. No. 13/656,520, (Feb. 1, 2013),15 pages.
"Notice of Allowance", U.S. Appl. No. 13/470,633, (Mar. 22, 2013), 7 pages.
"On-Screen Keyboard for Windows 7, Vista, XP with Touchscreen", Retrieved from <www.comfort-software.com/on-screen-keyboard.html> on Aug. 28, 2012, (Feb. 2, 2011), 3 pages.
"Position Sensors", *Android Developers*, Retrieved from <http://developer.android.com/guide/topics/sensors/sensors_position.html>on May 25, 2012, 5 pages.
"Restriction Requirement", U.S. Appl. No. 13/471,139, (Jan. 17, 2013), 7 pages.
"Restriction Requirement", U.S. Appl. No. 13/651,304, (Jan. 18, 2013), 7 pages.
"Restriction Requirement", U.S. Appl. No. 13/651,726, (Feb. 22, 2013), 6 pages.
"Restriction Requirement", U.S. Appl. No. 13/651,871, (Feb. 07, 2013), 6 pages.
"SolRxTM E-Series Multidirectional Phototherapy ExpandableTM 2-Bulb Full Body Panel System", Retrieved from: < http://www.solarcsystems.com/us_multidirectional_uv_light_therapy_1_intro.html > on Jul. 25, 2012,(2011), 4 pages.
"The Microsoft Surface Tablets Comes With Impressive Design and Specs", Retrieved from <http://microsofttabletreview.com/the-microsoft-surface-tablets-comes-with-impressive-design-and-specs> on Jan. 30, 2013, (Jun. 2012), 2 pages.
"Tilt Shift Lenses: Perspective Control", retrieved from http://www.cambridgeincolour.com/tutorials/tilt-shift-lenses1.htm, (Mar. 28, 2008),11 Pages.
"Virtualization Getting Started Guide", *Red Hat Enterprise Linux 6, Edition 0.2*, retrieved from <http://docs.redhat.com/docs/en-US/Red_Hat_Enterprise_Linux/6/html-single/Virtualization_Getting_Started_Guide/index.html> on Jun. 13, 2012, 24 pages.
"What is Active Alignment?", http://www.kasalis.com/active_alignment.html, retrieved on Nov. 22, 2012, 2 Pages.

Block, Steve et al., "DeviceOrientation Event Specification", *W3C, Editors Draft*, retrieved from <https://developer.palm.com/content/api/dev-guide/pdk/accessing-device-sensors.html> on May 25, 2012,(Jul. 12, 2011),14 pages.
Brown, Rich "Microsoft Shows Off Pressure-Sensitive Keyboard", retrieved from <http://news.cnet.com/8301-17938_105-10304792-1.html> on May 7, 2012, (Aug. 6, 2009), 2 pages.
Butler, Alex et al., "SideSight: Multi-"touch" Interaction around Small Devices", *In the proceedings of the 21st annual ACM symposium on User interface software and technology.*, retrieved from <http://research.microsoft.com/pubs/132534/sidesight_crv3.pdf> on May 29, 2012,(Oct. 19, 2008), 4 pages.
Crider, Michael "Sony Slate Concept Tablet "Grows" a Kickstand", Retrieved from: <http://androidcommunity.com/sony-slate-concept-tablet-grows-a-kickstand-20120116/> on May 4, 2012,(Jan. 16, 2012), 9 pages.
Das, Apurba et al., "Study of Heat Transfer through Multilayer Clothing Assemblies: A Theoretical Prediction", Retrieved from <http://www.autexrj.com/cms/zalaczone_pliki/5_013_11.pdf>, (Jun. 2011), 7 pages.
Dietz, Paul H., et al., "A Practical Pressure Sensitive Computer Keyboard", In Proceedings of UIST 2009,(Oct. 2009), 4 pages.
Glatt, Jeff "Channel and Key Pressure (Aftertouch).", Retrieved from: <http://home.roadrunner.com/~jgglatt/tutr/touch.htm> on Jun. 11, 2012, 2 pages.
Hanlon, Mike "ElekTex Smart Fabric Keyboard Goes Wireless", Retrieved from: <http://www.gizmag.com/go/5048/ > on May 7, 2012,(Jan. 15, 2006), 5 pages.
Iwase, Eiji "Multistep Sequential Batch Assembly of Three-Dimensional Ferromagnetic Microstructures with Elastic Hinges", Retrieved at <<http://ieeexplore.ieee.org/stamp/stamp.jsp?tp=&arnumber=1549861>> *Proceedings: Journal of Microelectromechanical Systems*, (Dec. 2005), 7 pages.
Kaur, Sukhmani "Vincent Liew's redesigned laptop satisfies ergonomic needs", Retrieved from: <http://www.designbuzz.com/entry/vincent-liew-s-redesigned-laptop-satisfies-ergonomic-needs/> on Jul. 27, 2012,(Jun. 21, 2010), 4 pages.
Khuntontong, Puttachat et al., "Fabrication of Molded Interconnection Devices by Ultrasonic Hot Embossing on Thin Polymer Films", IEEE Transactions on Electronics Packaging Manufacturing, vol. 32, No. 3,(Jul. 2009), pp. 152-156.
Li, et al., "Characteristic Mode Based Tradeoff Analysis of Antenna-Chassis Interactions for Multiple Antenna Terminals", *In IEEE Transactions on Antennas and Propagation*, Retrieved from <http://ieeexplore.ieee.org/stamp/stamp.jsp?tp=&arnumber=6060882>,(Feb. 2012),13 pages.
Linderholm, Owen "Logitech Shows Cloth Keyboard for PDAs", Retrieved from: <http://www.pcworld.com/article/89084/logitech_shows_cloth_keyboard_for_pdas.html> on May 7, 2012,(Mar. 15, 2002), 5 pages.
McLellan, Charles "Eleksen Wireless Fabric Keyboard: a first look", Retrieved from: <http://www.zdnetasia.com/eleksen-wireless-fabric-keyboard-a-first-look-40278954.htm> on May 7, 2012,(Jul. 17, 2006), 9 pages.
Piltch, Avram "ASUS Eee Pad Slider SL101 Review ", Retrieved from <http://www.laptopmag.com/review/tablets/asus-eee-pad-slider-sl101.aspx>, (Sep. 22, 2011), 5 pages.
Post, E.R. et al., "E-Broidery: Design and Fabrication of Textile-Based Computing", IBM Systems Journal, vol. 39, Issue 3 & 4,(Jul. 2000), pp. 840-860.
Purcher, Jack "Apple is Paving the Way for a New 3D GUI for IOS Devices", Retrieved from: <http://www.patentlyapple.com/patently-apple/2012/01/apple-is-paving-the-way-for-a-new-3d-gui-for-ios-devices.html> on Jun. 4, 2012,(Jan. 12, 2012),15 pages.
Takamatsu, Seiichi et al., "Flexible Fabric Keyboard with Conductive Polymer-Coated Fibers", In Proceedings of Sensors 2011,(Oct. 28, 2011), 4 pages.
Valliath, G T., "Design of Hologram for Brightness Enhancement in Color LCDs", Retrieved from <http://www.loreti.it/Download/PDF/LCD/44_05.pdf> on Sep. 17, 2012, 5 pages.
Williams, Jim "A Fourth Generation of LCD Backlight Technology", Retrieved from <http://cds.linear.com/docs/Application%20Note/an65f.pdf>, (Nov. 1995), 124 pages.

(56) References Cited

OTHER PUBLICATIONS

Zhang, et al., "Model-Based Development of Dynamically Adaptive Software", In Proceedings of ICSE 2006, Available at <http://www.irisa.fr/lande/lande/icse-proceedings/icse/p371.pdf>,(May 20, 2006), pp. 371-380.
"Non-Final Office Action", U.S. Appl. No. 13/656,520, (Jun. 5, 2013), 8 pages.
"PCT Search Report and Written Opinion", Application No. PCT/US2013/028948, (Jun. 21, 2013),11 pages.
"Restriction Requirement", U.S. Appl. No. 13/715,229, (Aug. 13, 2013), 7 pages.
"International Search Report and Written Opinion", Application No. PCT/US2013/044871, (Aug. 14, 2013),12 pages.
"International Search Report and Written Opinion", Application No. PCT/US2013/045049, (Sep. 16, 2013), 9 pages.
"Notice of Allowance", U.S. Appl. No. 13/656,520, (Oct. 2, 2013), 5 pages.
"Restriction Requirement", U.S. Appl. No. 13/715,133, (Oct. 28, 2013), 6 pages.
"Write & Learn Spellboard Advanced", Available at <http://somemanuals.com/VTECH,WRITE%2526LEARN--SPELLBOARD--ADV--71000,JIDFHE.PDF>, (2006), 22 pages.
Batiche, Steven N., et al., "Input Device with Interchangeable Surface", U.S. Appl. No. 13/974,749, filed Aug. 23, 2013, 51 pages.
Lance, David M., et al., "Media Processing Input Device", U.S. Appl. No. 13/655,065, filed Oct. 18, 2012, 43 pages.
"Non-Final Office Action", U.S. Appl. No. 13/603,918, Dec. 19, 2013, 12 pages.
"Corrected Notice of Allowance", U.S. Appl. No. 13/656,520, Jan. 16, 2014, 3 pages.
"Restriction Requirement", U.S. Appl. No. 13/715,133, Dec. 3, 2013, 6 pages.
"Notice of Allowance", U.S. Appl. No. 13/715,133, Jan. 6, 2014, 7 pages.
"Restriction Requirement", U.S. Appl. No. 13/603,918, Nov. 27, 2013, 8 pages.
"International Search Report and Written Opinion", Application No. PCT/US2013/044873, Nov. 22, 2013, 9 pages.
"Cholesteric Liquid Crystal", Retrieved from: <http://en.wikipedia.org/wiki/Cholesteric_liquid_crystal> on Aug. 6, 2012,(Jun. 10, 2012),2 pages.
"i-lnteractor electronic pen", Retrieved from: <http://www.alibaba.com/product-gs/331004878/i_Interactor_electronic_pen.html> on Jun. 19, 2012,5 pages.
"MPC Fly Music Production Controller", AKAI Professional, Retrieved from: <http://www.akaiprompc.com/mpc-fly> on Jul. 9, 2012,4 pages.
"Reflex LCD Writing Tablets", retrieved from <http://www.kentdisplays.com/products/lcdwritingtablets.html> on Jun. 27, 2012, 3 pages.
"SMART Board™ Interactive Display Frame Pencil Pack", Available at <http://downloads01.smarttech.com/media/sitecore/en/support/product/sbfpd/400series(interactivedisplayframes)/guides/smartboardinteractivedisplayframepencilpackv12mar09.pdf>,(2009),2 pages.
Qin, Yongqiang et al., "pPen: Enabling Authenticated Pen and Touch Interaction on Tabletop Surfaces", In Proceedings of ITS 2010, Available at <http://www.dfki.de/its2010/papers/pdf/po172.pdf>,(Nov. 2010),pp. 283-284.
Sumimoto, Mark "Touch & Write: Surface Computing With Touch and Pen Input", Retrieved from: <http://www.gottabemobile.com/2009/08/07/touch-write-surface-computing-with-touch-and-pen-input/> on Jun. 19, 2012,(Aug. 7, 2009),4 pages.
"Final Office Action", U.S. Appl. No. 13/595,700, Aug. 15, 2014, 6 pages.
"Final Office Action", U.S. Appl. No. 13/599,635, Aug. 08, 2014, 16 pages.
"Final Office Action", U.S. Appl. No. 13/655,065, Aug. 8, 2014, 20 pages.
"International Search Report and Written Opinion", Application No. PCT/US2013/041017, Jul. 17, 2014, 10 pages.
"International Search Report and Written Opinion", Application No. PCT/US2013/028768, Jun. 24, 2014, 12 pages.
"Microsoft Tablet PC", Retrieved from <http://web.archive.org/web/20120622064335/https://en.wikipedia.org/wiki/Microsoft_Tablet_PC> on Jun. 4, 2014, Jun. 21, 2012, 9 pages.
"Non-Final Office Action", U.S. Appl. No. 13/595,700, Jun. 18, 2014, 8 pages.
"Non-Final Office Action", U.S. Appl. No. 13/647,479, Jul. 3, 2014, 10 pages.
"Non-Final Office Action", U.S. Appl. No. 13/715,229, Aug. 19, 2014, 9 pages.
"Non-Final Office Action", U.S. Appl. No. 13/974,994, Jun. 4, 2014, 24 pages.
"Non-Final Office Action", U.S. Appl. No. 13/975,087, May 8, 2014, 18 pages.
"Restriction Requirement", U.S. Appl. No. 13/595,700, May 28, 2014, 6 pages.
"Corrected Notice of Allowance", U.S. Appl. No. 13/715,133, Apr. 2, 2014, 2 pages.
"Final Office Action", U.S. Appl. No. 13/603,918, Mar. 21, 2014, 14 pages.
"International Search Report and Written Opinion", Application No. PCT/US2013/065154, Feb. 5, 2014, 10 pages.
"International Search Report and Written Opinion", Application No. PCT/US2013/045283, Mar. 12, 2014, 19 pages.
"Non-Final Office Action", U.S. Appl. No. 13/599,635, Feb. 25, 2014, 13 pages.
"Non-Final Office Action", U.S. Appl. No. 13/655,065, Apr. 24, 2014, 16 pages.
"Ex Parte Quayle Action", U.S. Appl. No. 13/599,763, Nov. 14, 2014, 6 pages.
"Final Office Action", U.S. Appl. No. 13/647,479, Dec. 12, 2014, 12 pages.
"Non-Final Office Action", U.S. Appl. No. 13/653,184, Dec. 1, 2014, 7 pages.
"Non-Final Office Action", U.S. Appl. No. 13/655,065, Dec. 19, 2014, 24 pages.
"Non-Final Office Action", U.S. Appl. No. 13/974,994, Jan. 23, 2015, 26 pages.
"Notice of Allowance", U.S. Appl. No. 13/595,700, Jan. 21, 2015, 4 pages.
"Notice of Allowance", U.S. Appl. No. 13/603,918, Jan. 22, 2015, 8 pages.
"Notice of Allowance", U.S. Appl. No. 13/715,229, Jan. 9, 2015, 6 pages.
"Notice of Allowance", U.S. Appl. No. 14/177,018, Nov. 21, 2014, 7 pages.
"Restriction Requirement", U.S. Appl. No. 13/653,218, Nov. 7, 2014, 6 pages.
"Snugg iPad 3 Keyboard Case—Cover Ultra Slim Bluetooth Keyboard Case for the iPad 3 & iPad 2", Retrieved from <https://web.archive.org/web/20120810202056/http://www.amazon.com/Snugg-iPad-Keyboard-Case-Bluetooth/dp/B008CCHXJE> on Jan. 23, 2015, Aug. 10, 2012, 4 pages.
"Writer 1 for iPad 1 keyboard + Case (Aluminum Bluetooth Keyboard, Quick Eject and Easy Angle Function!)", Retrieved from <https://web.archive.org/web/20120817053825/http://www.amazon.com/keyboard-Aluminum-Bluetooth-Keyboard-Function/dp/B004OQLSLG> on Jan. 23, 2015, Aug. 17, 2012, 5 pages.
"Final Office Action", U.S. Appl. No. 13/595,700, Oct. 9, 2014, 8 pages.
"Final Office Action", U.S. Appl. No. 13/974,994, Oct. 6, 2014, 26 pages.
"Final Office Action", U.S. Appl. No. 13/975,087, Sep. 10, 2014, 19 pages.
"neXus Charging Cradle", Retrieved from <http://www.gen-xtech.com/neXus.php> on Jul. 28, 2014, Apr. 17, 2012, 2 pages.
"Non-Final Office Action", U.S. Appl. No. 13/471,282, Sep. 3, 2014, 13 pages.
"Non-Final Office Action", U.S. Appl. No. 13/603,918, Sep. 2, 2014, 13 pages.

(56) References Cited

OTHER PUBLICATIONS

"Rechargeable Stylus Pen", Retrieved from <http://www.e-pens.com/uk/rechargeable-stylus-pen.html> on Jul. 28, 2014, Jul. 5, 2013, 1 pages.
"Restriction Requirement", U.S. Appl. No. 13/653,184, Sep. 5, 2014, 6 pages.
Van "Lenovo Thinkpad Tablet 2 Review", Retrieved from: <http://www.digitaltrends.com/tablet-reviews/lenovo-thinkpad-tablet-2-review/> Jan. 29, 2014, Feb. 12, 2013, 7 Pages.
"Corrected Notice of Allowance", U.S. Appl. No. 13/603,918, May 8, 2015, 2 pages.
"Corrected Notice of Allowance", U.S. Appl. No. 13/715,229, Apr. 16, 2015, 2 pages.
"Corrected Notice of Allowance", U.S. Appl. No. 14/177,018, Mar. 2, 2015, 2 pages.
"Final Office Action", U.S. Appl. No. 13/655,065, Apr. 2, 2015, 23 pages.
"Non-Final Office Action", U.S. Appl. No. 13/599,635, Feb. 12, 2015, 16 pages.
"Non-Final Office Action", U.S. Appl. No. 13/647,479, Apr. 28, 2015, 11 pages.
"Non-Final Office Action", U.S. Appl. No. 13/653,218, Mar. 4, 2015, 16 pages.
"Non-Final Office Action", U.S. Appl. No. 13/975,087, Feb. 27, 2015, 20 pages.
"Notice of Allowance", U.S. Appl. No. 13/471,282, Apr. 30, 2015, 8 pages.
"Notice of Allowance", U.S. Appl. No. 13/653,184, Mar. 10, 2015, 6 pages.
"Supplemental Notice of Allowance", U.S. Appl. No. 13/595,700, Apr. 10, 2015, 2 pages.
"Supplemental Notice of Allowance", U.S. Appl. No. 13/595,700, May 4, 2015, 2 pages.
"Supplemental Notice of Allowance", U.S. Appl. No. 13/603,918, Apr. 20, 2015, 8 pages.

* cited by examiner

800 

802
Use a molding process to form a housing of a computing device that includes a plurality of ribs disposed within an internal surface of the housing

804
Performing a cutting operation to an outer surface of the housing that is opposite to the internal surface, the cutting operation performed to remove material of the housing between the plurality of ribs to form one or more vents that are configured to permit air to pass between an interior and exterior of the housing

806
Install the one or more components within the housing to manufacture a computing device

*Fig. 8*

HOUSING VENTS

The application claims priority under 35 U.S.C. Section 119(e) to U.S. Provisional Patent Application No. 61/659,349, filed Jun. 13, 2012 and titled "Computing Device Heat Transfer," the entire disclosure of which is incorporated by reference.

BACKGROUND

Computing devices are available in an ever increasing variety of configurations. As these configurations have gotten smaller, however, heat generated by the computing device has become increasingly problematic. For example, a computing device that is configured for a handheld form factor (e.g., phone, tablet) may have a limited amount of space to address heat generated by the components of the device.

Consequently, conventional techniques that were utilized to perform heat transfer could be inadequate and/or force compromise in selection of components when confronted with this form factor. For example, a manufacturer of a tablet computing device could be forced to forego processing capabilities provided by a processing system in situations in which the manufacturer is not able to solve a problem of how to keep the processing system in a specified temperature range during operation.

SUMMARY

Housing vent techniques are described. In one or more implementations, a molding process is used to form a housing of a computing device that includes a plurality of ribs disposed within an internal surface of the housing. A cutting operation is performed to an outer surface of the housing that is opposite to the internal surface to remove material of the housing between the plurality of ribs to form one or more vents that are configured to permit air to pass between an interior and exterior of the housing.

In one or more implementations, an apparatus comprises a housing configured for use by a computing device, the housing having a plurality of vents formed by using a molding process to form a plurality of ribs disposed within an internal surface of the housing and then performing a cutting operation to an outer surface of the housing to expose the plurality of ribs thereby forming the plurality of vents.

In one or more implementations, a computing device includes a housing configured to be held by one or more hands of a user, a display device secured to the housing to be viewable to the user, a processing system disposed within an interior of the housing, and a plurality of vents. The plurality of vents are formed as part of the housing a molding process to form a plurality of ribs disposed within an internal surface of the housing and then performing a cutting operation to an outer surface of the housing to expose the plurality of ribs. The plurality of vents is configured to permit air to pass between the interior and exterior of the housing to vent heat generated by the processing system during operation.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different instances in the description and the figures may indicate similar or identical items. Entities represented in the figures may be indicative of one or more entities and thus reference may be made interchangeably to single or plural forms of the entities in the discussion.

FIG. 8 is a flow diagram depicting a procedure in an example implementation in which vents of a housing are formed using a molding process and a cutting operation

DETAILED DESCRIPTION

Overview

Limitations involved with conventional techniques for heat transfer utilized by computing devices and other devices could have an adverse effect on overall functionality of the device. This effect, for instance, may limit functionality that may be incorporated by the device (e.g., speed of a processing system), a user's experience with the device (e.g., noise caused by fans and even an overall temperature of the device when physically contacted by a user), form factors that may be employed by the device (e.g., size and shape of the device that permits sufficient cooling), and so forth. Further, conventional techniques used to form vents to support heat transfer could be expensive and act as a bottleneck in the production of a device that utilized these conventional techniques.

Housing vent techniques are described. In one or more implementations, a housing is formed using a molding process, such as an injection molding process. A variety of different materials may be used in such as process, such as metals (e.g., magnesium) and so on. The molding process is used to form a plurality of ribs along an internal surface of the housing. A cutting operation is then performed to an outer surface of the housing to remove material of the housing, thereby exposed the plurality of ribs. In this way, open portions are formed between the plurality of ribs thereby forming a plurality of vents. Thus, these techniques may be used to leverage efficiency and reduced cost of a molding processing along with a precision of a cutting operation, such as a computer numerically controlled (CNC) operation. Further discussion of these and other techniques may be found in relation to the following sections.

In the following discussion, an example environment is first described that may employ the housing vent techniques described herein. Example procedures are then described which may be performed in the example environment as well as other environments. Consequently, performance of the example procedures is not limited to the example environment and the example environment is not limited to performance of the example procedures.

Example Environment

Figure 1:
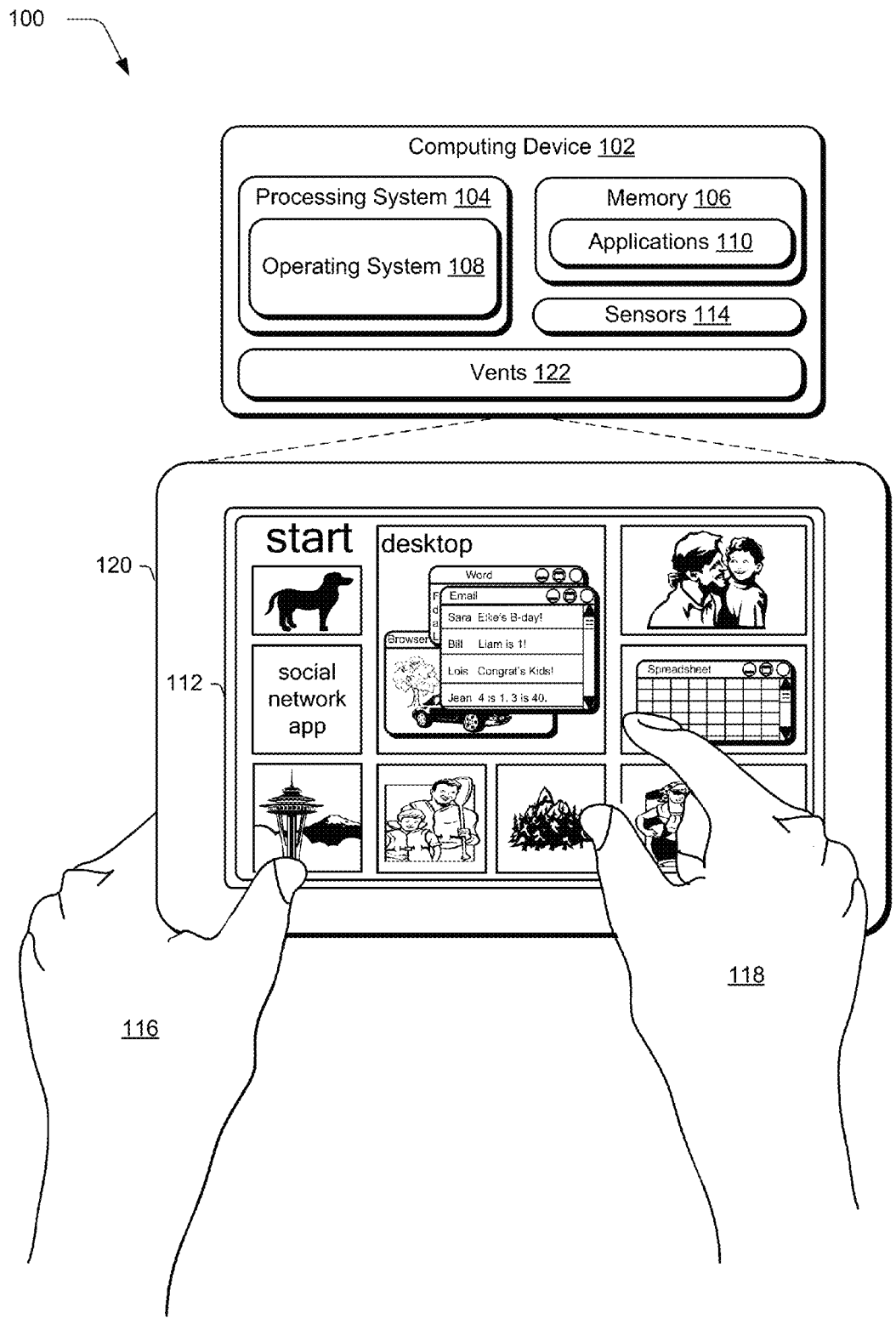
FIG. 1 is an illustration of an environment in an example implementation that is operable to employ techniques to perform heat transfer.

FIG. 1 is an illustration of an environment 100 in an example implementation that is operable to employ techniques described herein. The illustrated environment 100 includes a computing device 102 having a processing system 104 and a computer-readable storage medium that is illustrated as a memory 106 although other confirmations are also contemplated as further described below.

The computing device 102 may be configured in a variety of ways. For example, a computing device may be configured as a computer that is capable of communicating over a network, such as a desktop computer, a mobile station, an entertainment appliance, a set-top box communicatively coupled to a display device, a wireless phone, a game console, and so forth. Thus, the computing device 102 may range from full resource devices with substantial memory and processor resources (e.g., personal computers, game consoles) to a low-resource device with limited memory and/or processing resources (e.g., traditional set-top boxes, hand-held game consoles). Additionally, although a single computing device 102 is shown, the computing device 102 may be representative of a plurality of different devices, such as multiple servers utilized by a business to perform operations such as by a web service, a remote control and set-top box combination, an image capture device and a game console configured to capture gestures, and so on. Further discussion of different configurations that may be assumed by the computing device may be found in relation to FIG. 9.

The computing device 102 is further illustrated as including an operating system 108. The operating system 108 is configured to abstract underlying functionality of the computing device 102 to applications 110 that are executable on the computing device 102. For example, the operating system 108 may abstract the processing system 104, memory 106, network, and/or display device 112 functionality of the computing device 102 such that the applications 110 may be written without knowing "how" this underlying functionality is implemented. The application 110, for instance, may provide data to the operating system 108 to be rendered and displayed by the display device 112 without understanding how this rendering will be performed. The operating system 108 may also represent a variety of other functionality, such as to manage a file system and user interface that is navigable by a user of the computing device 102.

The computing device 102 may support a variety of different interactions. For example, the computing device 102 may include one or more hardware devices that are manipulable by a user to interact with the device, such as a keyboard, cursor control device (e.g., mouse), and so on. The computing device 102 may also support gestures, which may be detected in a variety of ways. The computing device 102, for instance, may support touch gestures that are detected using touch functionality of the computing device 102. The sensors 114, for instance, may be configured to provide touchscreen functionality in conjunction with the display device 112, alone as part of a track pad, and so on.

In the illustrated example, the computing device 102 is configured for use in a hand held form factor that is configured to be held by one or more hands 116, 118 of a user, although other examples are also contemplated. Thus, a housing 120 of the computing device 102 may be configured to support this form factor.

As previously described, however, support of such a form factor may involve addressing heat generated by components disposed within the housing 120, such as the processing system 104. One technique that may be used is to form vents 122 in the housing 120. However, conventional techniques that were employed to form the vents could be expensive, result in inconsistencies that have an adverse effect on a look-and-feel of the device as well as operation of the vents, and so on. Accordingly, housing vent techniques are described herein that may be utilized to promote heat transfer and be formed as part of the housing 120 in an efficient manner.

Figure 2:
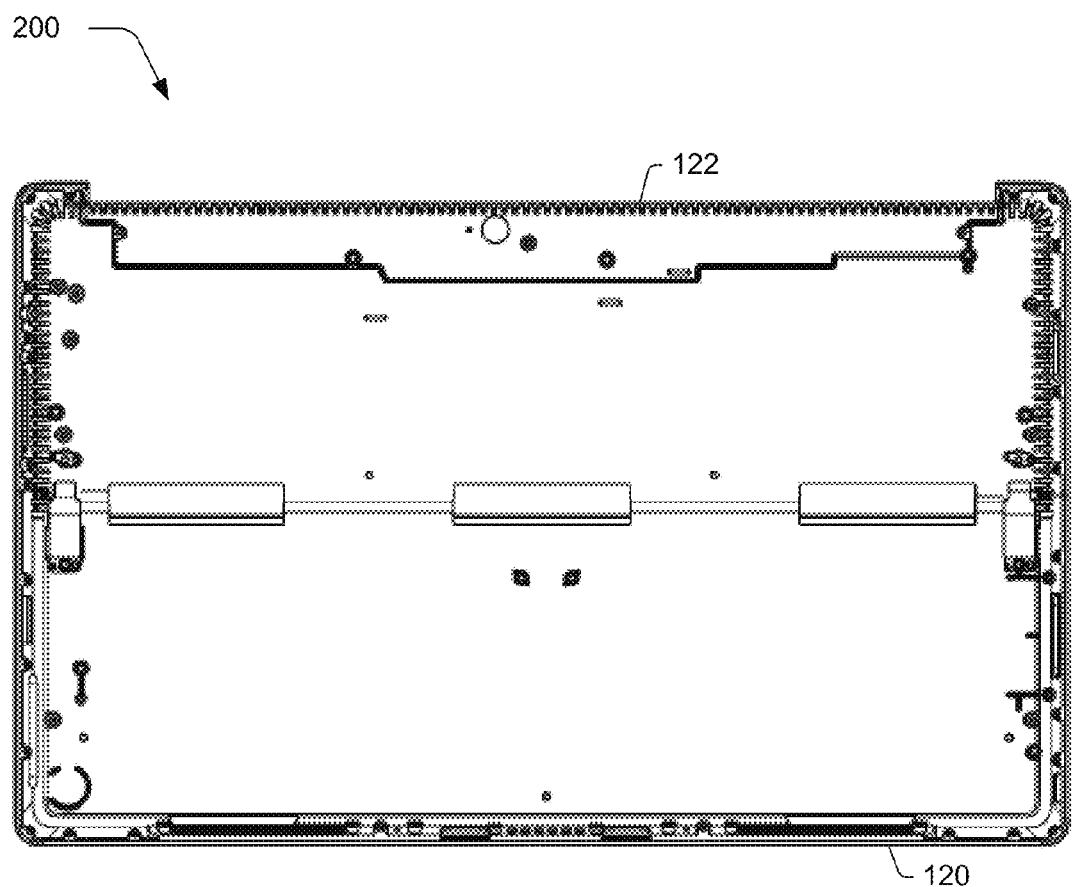
FIG. 2 depicts a top view of an example of a housing of FIG. 1.

FIG. 2 depicts a top view 200 of an example of the housing 120 of FIG. 1. In this top view 200, an interior surface of the housing 120 is shown that is configured to accept one or more components of the computing device 102, e.g., a processing system 104, memory 106, and so on. The display device 110 of FIG. 1 may then be secured to the housing 120 to permit a user to view the display device 110 when holding the housing 120.

The vents 122 are illustrated as formed along a side perimeter of the housing 120. For example, the side perimeter may be disposed between a top surface of the computing device 102 that includes the display device 110 and a rear surface of the housing 120. In this example, the vents 122 are disposed substantially along a top side of the side perimeter and approximately halfway down along left and right sides of the side perimeter, respectively. In this way, the vents 122 may be configured to provide substantial cooling by permitting heat to escape, especially when the computing device 102 is oriented in a landscape orientation.

The computing device 102, for instance, may be configured for removable attachment to an input device (e.g., a pressure sensitive QWERTY keyboard through use of magnetism) to a bottom side of the side perimeter. Thus, when in such an orientation the computing device 102 may perform processing intensive tasks, which may cause the processing system 104 to generate significant amounts of heat. Therefore, by positioning of the vents 122 in this example this heat may be efficiently transferred. It should be readily apparent, however, that other positioning and orientation of the vents are also contemplated without departing from the spirit and scope thereof.

Figure 3:
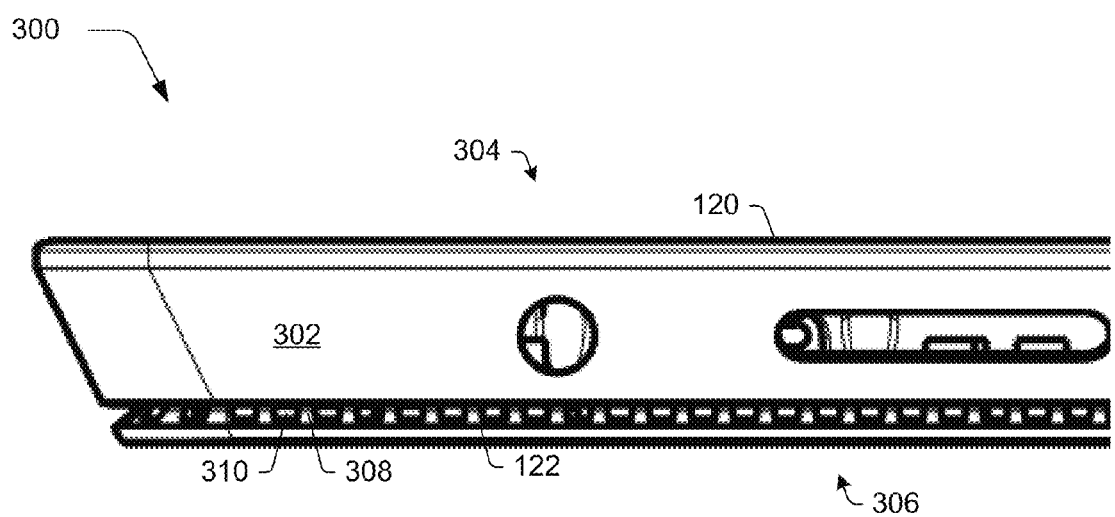
FIG. 3 depicts an expanded side view of the housing of FIG. 2 showing vents in greater detail.

FIG. 3 depicts an expanded side view 300 of the housing 120 of FIG. 2 showing the vents 122 in greater detail. As shown in the side view, the side perimeter 302 of the housing 120 forms an angle between a larger top surface 304 of the housing 120 that is configured to include the display device 120 and a smaller rear surface 306 of the housing 120.

The vents 122 in this example are arranged as following a longitudinal axis of the side perimeter and disposed proximal to the rear surface 306 of the housing 120. The vents 122 are formed using a plurality of ribs 308 with openings 310 formed between the ribs 308 along a slot 312 in the housing 120. The vents 122 may be formed in a variety of ways, further discussion of which may be found in relation to the following description and related figure.

Figure 4:
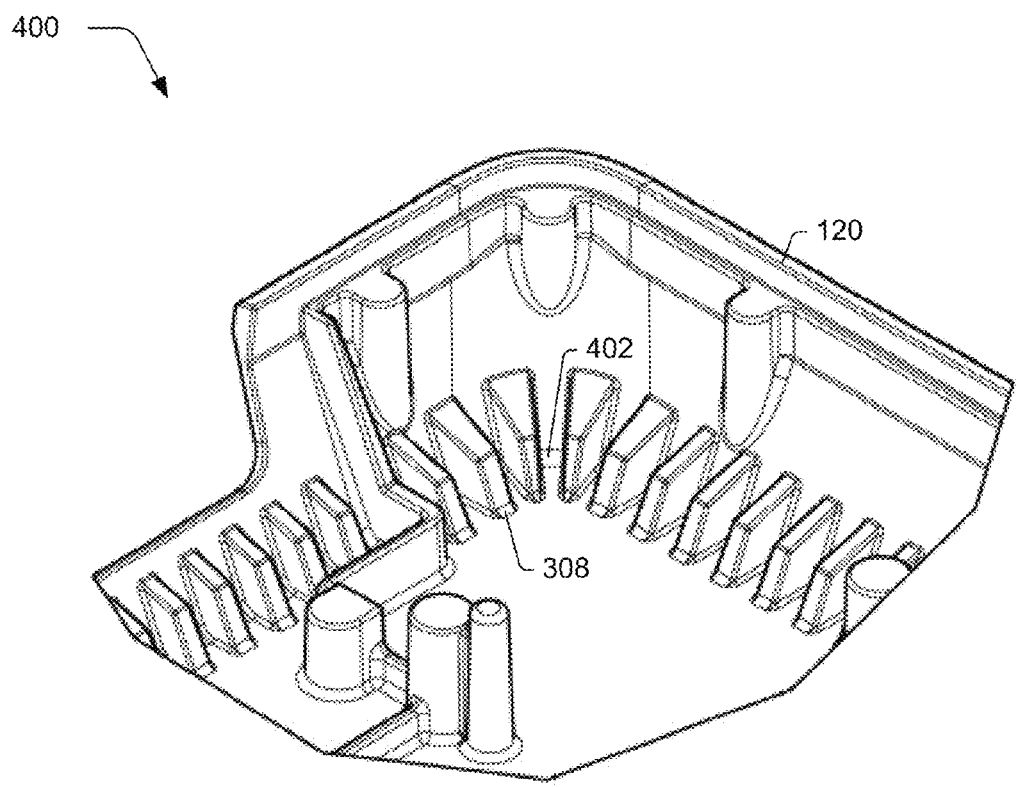
FIGS. 4 and 5 depict views of internal and external surfaces of a corner of the housing, respectively, as formed using a molding process.
Figure 5:
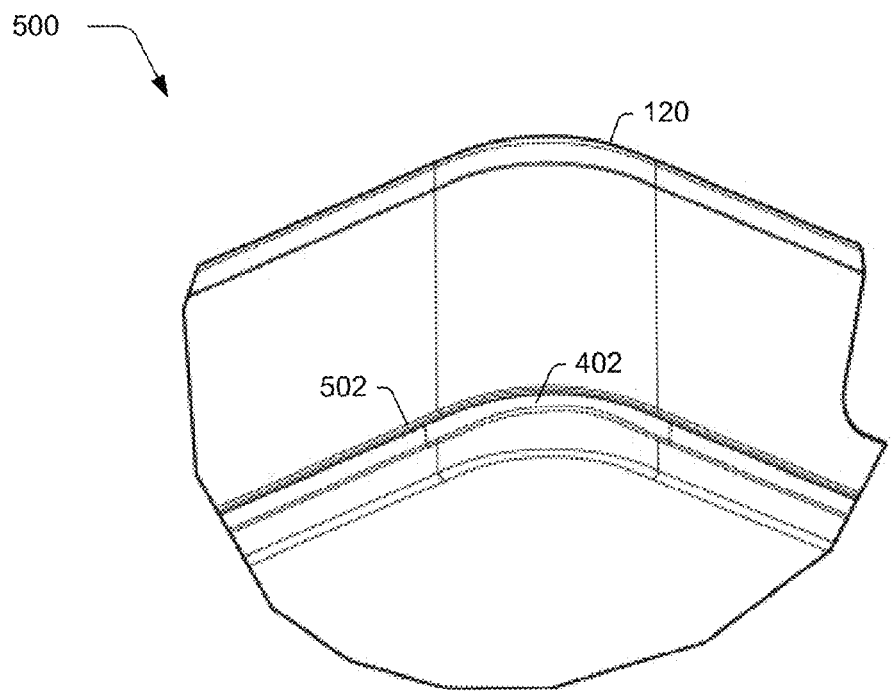

FIGS. 4 and 5 depict views of internal and external surfaces 400, 500 of a corner of the housing 120, respectively, as formed using a molding process. The internal surface 400 of FIG. 4 shows a plurality of ribs 308 formed as part of the housing and material 402 formed between the ribs 308. The external surface 500 shows the material 402 as formed within a channel 502 of the housing 120.

The housing 120 of FIGS. 4 and 5 may be formed from a variety of different molding processes using a variety of different materials. For example, the housing 120 may be formed using an injection molding process to form the plurality of ribs 308 and material in-between along with the side and bottom surfaces of the housing 120 in a single operation. Further, this process may be used for a variety of different materials, such as metals that may include magnesium and so on. Thus, the housing 120 at this stage may be formed in an efficient manner in terms of both cost and time. Vents may then be formed in the molded housing, an example of which may be found in relation to the following discussion and related figure.

Figure 6:
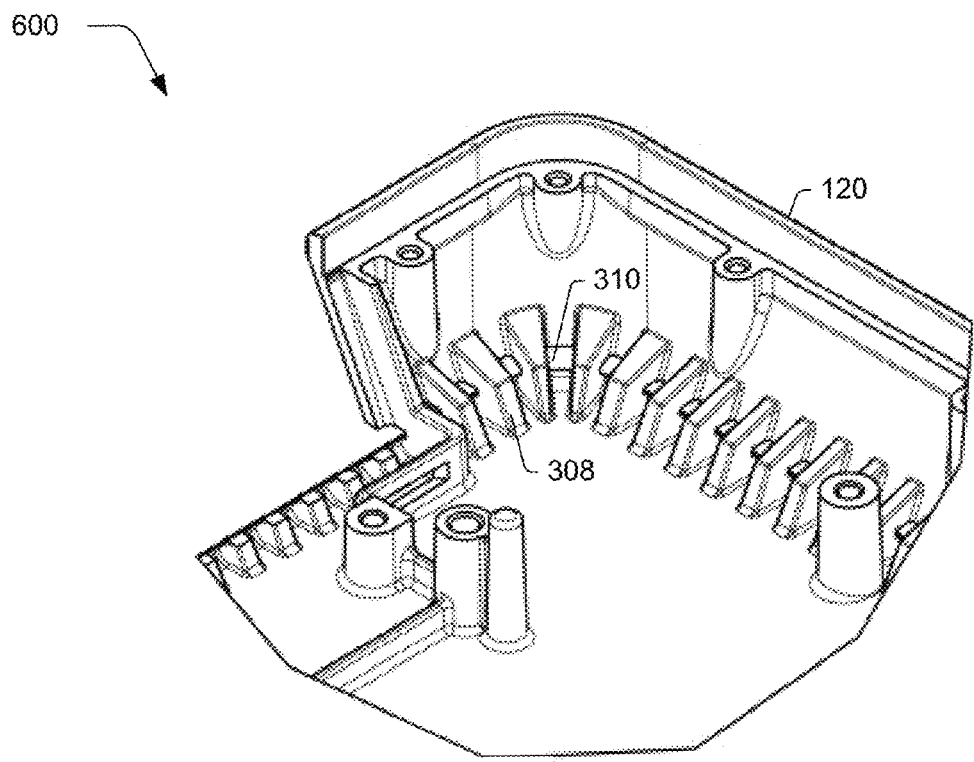
FIGS. 6 and 7 depict views of internal and external surfaces of the corner of the housing, respectively, after application of a cutting operation to the molded housing of FIGS. 4 and 5.
Figure 7:
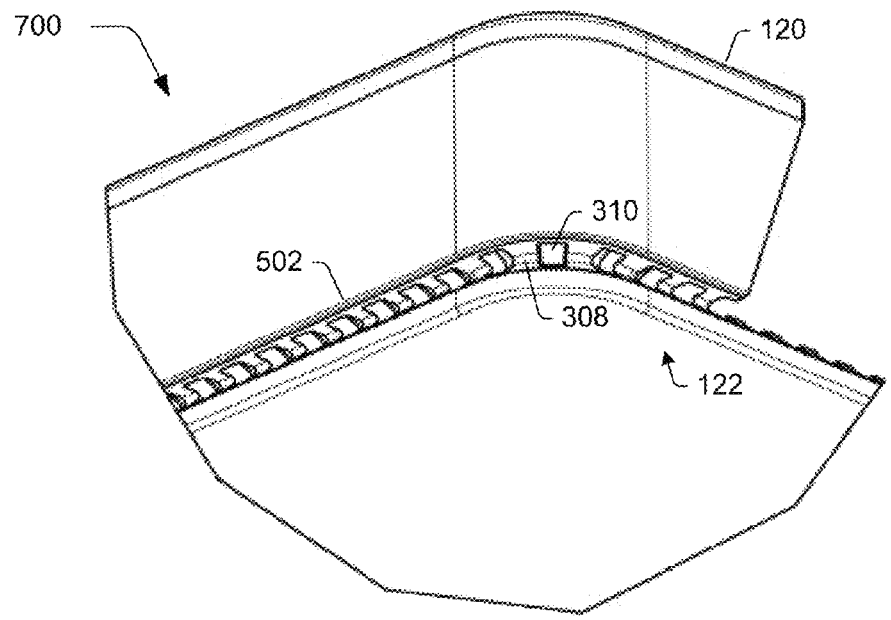

FIGS. 6 and 7 depict views of internal and external surfaces 600, 700 of the corner of the housing 120, respectively, after application of a cutting operation to the molded housing of FIGS. 4 and 5. In these views, a result of a cutting operation is shown to remove the material 502 shown in FIGS. 4 and 5. Removal of this material 502 results in formation of openings 310 between the plurality of ribs 308, thereby forming the vents 122.

The cutting operation, for instance, may be performed to follow the channel 502. Material 402 may be removed by the cutting operation at a depth such that the plurality of ribs 310 is exposed to an exterior 700 of the housing. A variety of different cutting operations may be performed, such as a CNC operation to form a v-shaped slot along the channel 502. In this way, the vents 122 may be formed to have consistent sized and shaped openings as with a CNC operation yet take advantage of efficiency of a molding process.

Example Procedures

The following discussion describes heat transfer techniques that may be implemented utilizing the previously described systems and devices. Aspects of each of the procedures may be implemented in hardware, firmware, or software, or a combination thereof. The procedures are shown as a set of blocks that specify operations performed by one or more devices and are not necessarily limited to the orders shown for performing the operations by the respective blocks. In portions of the following discussion, reference will be made to FIGS. 1-7.

FIG. 8 depicts a procedure 800 in an example implementation in which vents of a housing are formed using a molding process and a cutting operation. A molding process is used to form a housing of a computing device that includes a plurality of ribs disposed within an internal surface of the housing (block 802). For example, a molding process may be used to form the housing to include side and rear surfaces for use in a hand-held form factor, such as a tablet computer, mobile phone, portable game device, portable music player, and so on. The molding process may be used to form the housing a metal (e.g., magnesium) to include a plurality of ribs 308 and material 402 disposed between the ribs.

A cutting operation is performed to an outer surface of the housing that is opposite to the internal surface, the cutting operation performed to remove material of the housing between the plurality of ribs to form one or more vents that are configured to permit air to pass between an interior and exterior of the housing (block 804). For example, a CNC cutting operation may be performed to form a v-shaped slot along the channel 502 to remove the material 402 disposed between the ribs. This may cause the ribs 308 to be exposed to an exterior surface of the housing 120 as well as form openings 310 between the ribs 308. In this way, the vents 122 may be formed to permit air to pass through the vents 122, thereby support cooling of components (e.g., the processing system 104) disposed within the interior of the housing 120.

One or more components may then be installed within the housing to manufacture the computing device (block 806). This may include the processing system 104 and memory 106, a power supply, battery, and so on. The display device 110 may also be installed, such as to form the computing device to support a hand-held form factor. A variety of other examples are also contemplated.

Example System and Device

Figure 9:
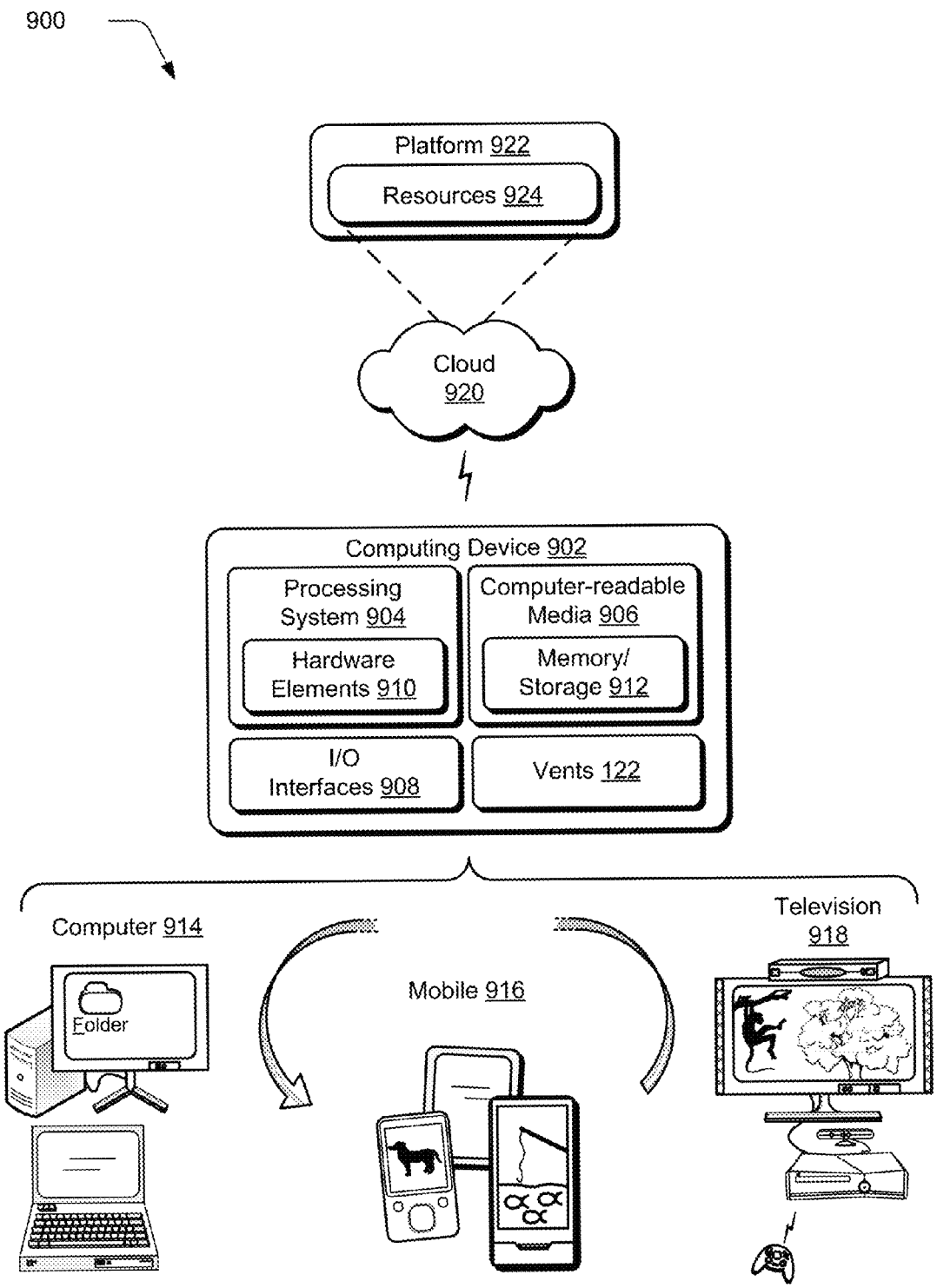
FIG. 9 illustrates an example system including various components of an example device that can be implemented as any type of computing device as described with reference to FIGS. 1-8 to implement embodiments of the techniques described herein.

FIG. 9 illustrates an example system generally at 900 that includes an example computing device 902 that is representative of one or more computing systems and/or devices that may implement the various techniques described herein. Accordingly, the computing device 902 is illustrated as including vents 122, which may be formed using the techniques described above. Further, these techniques may be controlled using one or more modules that are configured to implement the manufacturing process described herein, such as to control a molding process, cutting operation, and so on and thus may not include the vents 122 but rather control operations to form the vents 122. Accordingly, the computing device 902 may assume a variety of configurations, such as a server of a service provider, a device associated with a client (e.g., a client device), an on-chip system, and/or any other suitable computing device or computing system.

The example computing device 902 as illustrated includes a processing system 904, one or more computer-readable media 906, and one or more I/O interface 908 that are communicatively coupled, one to another. Although not shown, the computing device 902 may further include a system bus or other data and command transfer system that couples the various components, one to another. A system bus can include any one or combination of different bus structures, such as a memory bus or memory controller, a peripheral bus, a universal serial bus, and/or a processor or local bus that utilizes any of a variety of bus architectures. A variety of other examples are also contemplated, such as control and data lines.

The processing system 904 is representative of functionality to perform one or more operations using hardware. Accordingly, the processing system 904 is illustrated as including hardware element 910 that may be configured as processors, functional blocks, and so forth. This may include implementation in hardware as an application specific integrated circuit or other logic device formed using one or more semiconductors. The hardware elements 910 are not limited by the materials from which they are formed or the processing mechanisms employed therein. For example, processors may be comprised of semiconductor(s) and/or transistors (e.g., electronic integrated circuits (ICs)). In such a context, processor-executable instructions may be electronically-executable instructions.

The computer-readable storage media 906 is illustrated as including memory/storage 912. The memory/storage 912 represents memory/storage capacity associated with one or more computer-readable media. The memory/storage component 912 may include volatile media (such as random access memory (RAM)) and/or nonvolatile media (such as read only memory (ROM), Flash memory, optical disks, magnetic disks, and so forth). The memory/storage component 912 may include fixed media (e.g., RAM, ROM, a fixed hard drive, and so on) as well as removable media (e.g., Flash memory, a removable hard drive, an optical disc, and so forth). The computer-readable media 906 may be configured in a variety of other ways as further described below.

Input/output interface(s) 908 are representative of functionality to allow a user to enter commands and information to computing device 902, and also allow information to be presented to the user and/or other components or devices using various input/output devices. Examples of input devices include a keyboard, a cursor control device (e.g., a mouse), a microphone, a scanner, touch functionality (e.g., capacitive or other sensors that are configured to detect physical touch), a camera (e.g., which may employ visible or non-visible wavelengths such as infrared frequencies to recognize movement as gestures that do not involve touch), and so forth. Examples of output devices include a display device (e.g., a monitor or projector), speakers, a printer, a network card, tactile-response device, and so forth. Thus, the computing device 902 may be configured in a variety of ways as further described below to support user interaction.

Various techniques may be described herein in the general context of software, hardware elements, or program modules. Generally, such modules include routines, programs, objects, elements, components, data structures, and so forth that perform particular tasks or implement particular abstract data types. The terms "module," "functionality," and "component" as used herein generally represent software, firmware, hardware, or a combination thereof. The features of the techniques described herein are platform-independent, meaning that the techniques may be implemented on a variety of commercial computing platforms having a variety of processors.

An implementation of the described modules and techniques may be stored on or transmitted across some form of computer-readable media. The computer-readable media may include a variety of media that may be accessed by the computing device 902. By way of example, and not limitation, computer-readable media may include "computer-readable storage media" and "computer-readable signal media."

"Computer-readable storage media" may refer to media and/or devices that enable persistent and/or non-transitory storage of information in contrast to mere signal transmission, carrier waves, or signals per se. Thus, computer-readable storage media refers to non-signal bearing media. The computer-readable storage media includes hardware such as volatile and non-volatile, removable and non-removable media and/or storage devices implemented in a method or technology suitable for storage of information such as computer readable instructions, data structures, program modules, logic elements/circuits, or other data. Examples of computer-readable storage media may include, but are not limited to, RAM, ROM, EEPROM, flash memory or other memory technology, CD-ROM, digital versatile disks (DVD) or other optical storage, hard disks, magnetic cassettes, magnetic tape, magnetic disk storage or other magnetic storage devices, or other storage device, tangible media, or article of manufacture suitable to store the desired information and which may be accessed by a computer.

"Computer-readable signal media" may refer to a signal-bearing medium that is configured to transmit instructions to the hardware of the computing device 902, such as via a network. Signal media typically may embody computer readable instructions, data structures, program modules, or other data in a modulated data signal, such as carrier waves, data signals, or other transport mechanism. Signal media also include any information delivery media. The term "modulated data signal" means a signal that has one or more of its characteristics set or changed in such a manner as to encode information in the signal. By way of example, and not limitation, communication media include wired media such as a wired network or direct-wired connection, and wireless media such as acoustic, RF, infrared, and other wireless media.

As previously described, hardware elements 910 and computer-readable media 906 are representative of modules, programmable device logic and/or fixed device logic implemented in a hardware form that may be employed in some embodiments to implement at least some aspects of the techniques described herein, such as to perform one or more instructions. Hardware may include components of an integrated circuit or on-chip system, an application-specific integrated circuit (ASIC), a field-programmable gate array (FPGA), a complex programmable logic device (CPLD), and other implementations in silicon or other hardware. In this context, hardware may operate as a processing device that performs program tasks defined by instructions and/or logic embodied by the hardware as well as a hardware utilized to store instructions for execution, e.g., the computer-readable storage media described previously.

Combinations of the foregoing may also be employed to implement various techniques described herein. Accordingly, software, hardware, or executable modules may be implemented as one or more instructions and/or logic embodied on some form of computer-readable storage media and/or by one or more hardware elements 910. The computing device 902 may be configured to implement particular instructions and/or functions corresponding to the software and/or hardware modules. Accordingly, implementation of a module that is executable by the computing device 902 as software may be achieved at least partially in hardware, e.g., through use of computer-readable storage media and/or hardware elements 910 of the processing system 904. The instructions and/or functions may be executable/operable by one or more articles of manufacture (for example, one or more computing devices 902 and/or processing systems 904) to implement techniques, modules, and examples described herein.

As further illustrated in FIG. 9, the example system 900 enables ubiquitous environments for a seamless user experience when running applications on a personal computer (PC), a television device, and/or a mobile device. Services and applications run substantially similar in all three environments for a common user experience when transitioning from one device to the next while utilizing an application, playing a video game, watching a video, and so on.

In the example system 900, multiple devices are interconnected through a central computing device. The central computing device may be local to the multiple devices or may be located remotely from the multiple devices. In one embodiment, the central computing device may be a cloud of one or more server computers that are connected to the multiple devices through a network, the Internet, or other data communication link.

In one embodiment, this interconnection architecture enables functionality to be delivered across multiple devices to provide a common and seamless experience to a user of the multiple devices. Each of the multiple devices may have different physical requirements and capabilities, and the central computing device uses a platform to enable the delivery of an experience to the device that is both tailored to the device and yet common to all devices. In one embodiment, a class of target devices is created and experiences are tailored to the generic class of devices. A class of devices may be defined by physical features, types of usage, or other common characteristics of the devices.

In various implementations, the computing device 902 may assume a variety of different configurations, such as for computer 914, mobile 916, and television 918 uses. Each of these configurations includes devices that may have generally different constructs and capabilities, and thus the computing device 902 may be configured according to one or more of the different device classes. For instance, the computing device 902 may be implemented as the computer 914 class of a device that includes a personal computer, desktop computer, a multi-screen computer, laptop computer, netbook, and so on.

The computing device 902 may also be implemented as the mobile 916 class of device that includes mobile devices, such as a mobile phone, portable music player, portable gaming device, a tablet computer, a multi-screen computer, and so on. The computing device 902 may also be implemented as the television 918 class of device that includes devices having or connected to generally larger screens in casual viewing environments. These devices include televisions, set-top boxes, gaming consoles, and so on.

The techniques described herein may be supported by these various configurations of the computing device 902 and are not limited to the specific examples of the techniques described herein.

Functionality may also be implemented all or in part through use of a distributed system, such as over a "cloud" 920 via a platform 922 as described below. The cloud 920 includes and/or is representative of a platform 922 for resources 924. The platform 922 abstracts underlying functionality of hardware (e.g., servers) and software resources of the cloud 920. The resources 924 may include applications and/or data that can be utilized while computer processing is executed on servers that are remote from the computing device 902. Resources 924 can also include services provided over the Internet and/or through a subscriber network, such as a cellular or Wi-Fi network.

The platform 922 may abstract resources and functions to connect the computing device 902 with other computing devices. The platform 922 may also serve to abstract scaling of resources to provide a corresponding level of scale to encountered demand for the resources 924 that are implemented via the platform 922. Accordingly, in an interconnected device embodiment, implementation of functionality described herein may be distributed throughout the system 900. For example, the functionality may be implemented in part on the computing device 902 as well as via the platform 922 that abstracts the functionality of the cloud 920.

CONCLUSION

Although the invention has been described in language specific to structural features and/or methodological acts, it is to be understood that the invention defined in the appended claims is not necessarily limited to the specific features or acts described. Rather, the specific features and acts are disclosed as example forms of implementing the claimed invention.

What is claimed is:

1. A method comprising:
    using a molding process to form a housing of a computing device that includes a plurality of ribs disposed within an internal surface of the housing; and
    performing a cutting operation to an outer surface of the housing that is opposite to the internal surface, the cutting operation performed to remove material of the housing between the plurality of ribs to form one or more vents that permit air to pass between an interior and exterior of the housing.

2. A method as described in claim 1, wherein the molding process is an injection molding process and the housing is formed from a metal.

3. A method as described in claim 2, wherein the metal includes magnesium.

4. A method as described in claim 1, wherein the cutting operation is a slot cutting operation.

5. A method as described in claim 4, wherein the slot cutting operation causes a v-shaped slot to be formed in the housing.

6. A method as described in claim 1, wherein the housing is formed using the molding process to form a back surface of the computing device in compliance with a hand-held form factor along with the plurality of ribs, the back surface configured to be disposed as generally opposite to a display device of the computing device.

7. A method as described in claim 6, wherein the one or more vents are formed along a side perimeter of the housing that is configured to be disposed between the back surface and the display device.

8. A method as described in claim 7, wherein the side perimeter includes a plurality of sides of the housing.

9. A computing device comprising:
    a housing to be held by one or more hands of a user,
    a display device secured to the housing to be viewable to the user;
    a processing system disposed within an interior of the housing; and
    a plurality of vents formed as part of the housing having a plurality of ribs disposed within an internal surface of the housing, the plurality of ribs being exposed to an outer surface of the housing a single continuous slot in the housing that includes the plurality of ribs, the plurality of vents permitting air to pass between the interior and exterior of the housing to vent heat generated by the processing system during operation.

10. A computing device as described in claim 9, wherein the plurality of ribs are formed molding process an injection molding process and the housing is formed from a metal.

11. A computing device as described in claim 10, wherein the metal includes magnesium.

12. A computing device as described in claim 9, wherein the plurality of vents are formed along a side perimeter of the housing that is disposed between a back surface of the housing and the display device.

* * * * *